United States Patent
Wu et al.

(10) Patent No.: US 8,581,681 B2
(45) Date of Patent: Nov. 12, 2013

(54) MAGNET ASSEMBLIES AND METHODS FOR TEMPERATURE CONTROL OF THE MAGNET ASSEMBLIES

(75) Inventors: Anbo Wu, Shanghai (CN); Jun Pan, Shanghai (CN); Yan Zhao, Shanghai (CN); Xianrui Huang, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 17 days.

(21) Appl. No.: 13/164,827

(22) Filed: Jun. 21, 2011

(65) Prior Publication Data
US 2012/0004109 A1    Jan. 5, 2012

(30) Foreign Application Priority Data
Jun. 30, 2010   (CN) .......................... 2010 1 0218773

(51) Int. Cl.
*H01F 1/00* (2006.01)
*H01F 7/00* (2006.01)
*H01F 6/00* (2006.01)

(52) U.S. Cl.
USPC ....................................... 335/216

(58) Field of Classification Search
USPC ....................................... 335/216
See application file for complete search history.

(56) References Cited

U.S. PATENT DOCUMENTS

| | | | | |
|---|---|---|---|---|
| 4,484,814 A * | 11/1984 | Kawaguchi et al. | ......... | 335/301 |
| 4,707,676 A * | 11/1987 | Saitou et al. | ................. | 335/216 |
| 4,968,961 A * | 11/1990 | Miyajima et al. | ............ | 335/216 |
| 5,018,359 A * | 5/1991 | Horikawa et al. | ............. | 62/51.1 |
| 5,138,383 A * | 8/1992 | Shiga et al. | .................... | 335/216 |
| 7,276,997 B2 * | 10/2007 | Lvovsky et al. | ............... | 335/299 |
| 7,500,366 B2 * | 3/2009 | Xu et al. | ............................ | 62/6 |
| 2002/0180571 A1 * | 12/2002 | Takeshima et al. | .......... | 335/216 |
| 2005/0001621 A1 * | 1/2005 | Laskaris et al. | ............... | 324/318 |
| 2006/0098337 A1 * | 5/2006 | Guthrie et al. | ................ | 360/126 |
| 2006/0181382 A1 * | 8/2006 | Lvovsky et al. | .............. | 335/296 |
| 2006/0226940 A1 * | 10/2006 | Lee et al. | ...................... | 335/216 |
| 2007/0001792 A1 * | 1/2007 | Nemoto et al. | ............... | 335/216 |
| 2007/0130961 A1 * | 6/2007 | Xu et al. | ............................ | 62/6 |
| 2008/0002326 A1 * | 1/2008 | Watanabe | ...................... | 361/103 |
| 2011/0069418 A1 * | 3/2011 | Huang et al. | .................... | 361/19 |

* cited by examiner

*Primary Examiner* — Alexander Talpalatski
(74) *Attorney, Agent, or Firm* — Global Patent Operation; Mark A. Conklin

(57) ABSTRACT

A magnet assembly is provided. The magnet assembly comprises a magnet configured to generate a magnetic field and an iron shield configured to shield the magnet. The magnet assembly further comprises one or more positive temperature coefficient heaters disposed on the iron shield and configured to stabilize temperature of the iron shield. An iron shield assembly and a method for temperature control of the magnet assembly are also presented.

15 Claims, 3 Drawing Sheets

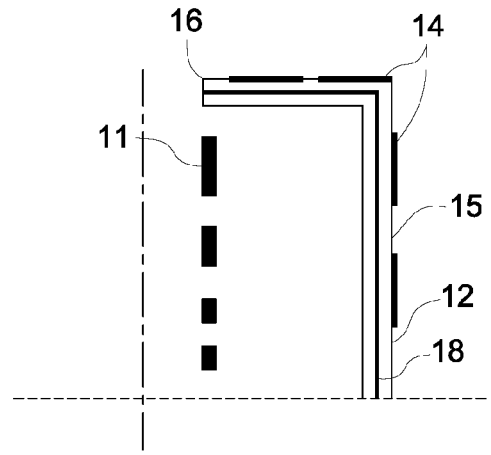
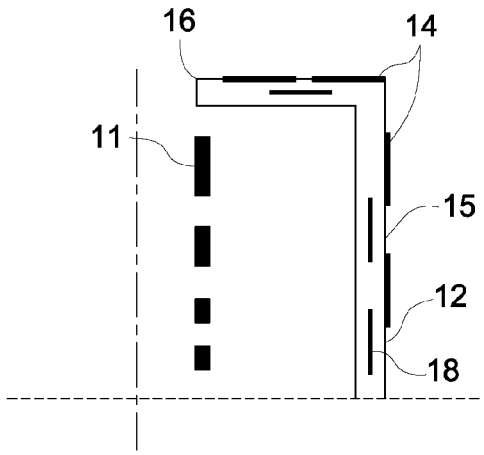
FIG. 4  FIG. 5
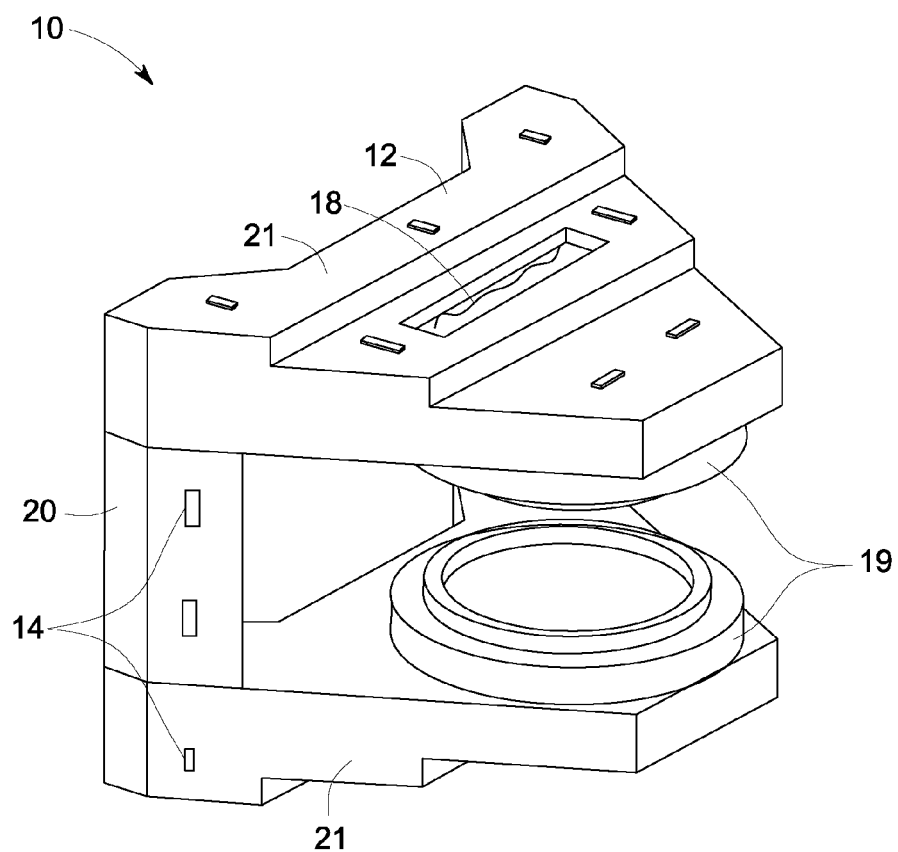
FIG. 6

MAGNET ASSEMBLIES AND METHODS FOR TEMPERATURE CONTROL OF THE MAGNET ASSEMBLIES

BACKGROUND

1. Field of the Invention

The field of the invention relates generally to magnet assemblies and methods for temperature control of the magnet assemblies. More particularly, this disclosure relates to magnet assemblies equipped with temperature control elements on iron shields thereof and methods for temperature control of the magnet assemblies.

2. Background of the Invention

Magnets, such as superconducting magnets, permanent magnets, and/or resistive magnets, have been used in various applications, for example, in magnetic resonance imaging (MRI) applications. Generally, magnets are magnetically shielded to prevent the magnetic field created by such magnets from adversely interacting with electronic equipment located near the magnets. Some techniques for magnetically shielding such magnets include active and/or passive shielding.

Typically, passively shielded magnets, such as passively shielded superconducting magnets, are employed in some applications since passive shielding is more cost-effective than active shielding. Passive shielding generally employs iron shields (iron yokes) for shielding of magnets. However, magnetic properties of iron shields vary with variation of temperatures. As a result, magnetic fields generated by such magnets are unstable and fluctuate due to the variation of the temperatures of the iron shields, which is disadvantageous to the magnetic fields.

There have been attempts to provide temperature control for passively shielded magnets, such as active temperature control configurations. Such active configurations typically employ multiple temperature sensors that monitor the temperature of the iron shields and a controller that uses the data from the temperature sensors to control heaters to keep the system within a temperature range according to some control algorithm such as a Proportional-Integral-Derivative (PID) control algorithm. Such active control adds complexity and cost to the temperature system.

There is a continued need for new and improved magnet assemblies and methods for temperature control of the magnet assemblies.

BRIEF DESCRIPTION

A magnet assembly is provided in accordance with one embodiment of the invention. The magnet assembly comprises a magnet configured to generate a magnetic field and an iron shield configured to shield the magnet. The magnet assembly further comprises one or more positive temperature coefficient heaters disposed on the iron shield and configured to stabilize temperature of the iron shield. The magnet assembly provides the passive temperature control without active controllers or temperature sensors.

An iron shield assembly is provided in accordance with another embodiment of the invention. The iron shield assembly comprises an iron shield configured to shield the magnet to confine stray field generated by the magnet and one or more positive temperature coefficient heaters disposed on the iron shield for stabilization of temperature of the iron shield. The iron shield assembly provides a passive temperature control without temperature sensors or temperature controllers.

Another aspect of the invention further comprises a method of providing temperature control of a magnet assembly. The method comprises providing a magnet configured to generate a magnetic field, disposing an iron shield about at least a portion of the magnet, coupling one or more positive temperature coefficient heaters to the iron shield, and passively controlling a temperature of the iron shield.

BRIEF DESCRIPTION OF THE DRAWINGS

The above and other aspects, features, and advantages of the present disclosure will become more apparent in light of the subsequent detailed description when taken in conjunction with the accompanying drawings in which:

FIGS. 4-5 are schematic axis-symmetric cross sectional plane views of the magnet assembly including phase change elements in accordance with various embodiments;

FIG. 6 is a schematic diagram of the magnet assembly in accordance with another embodiment.

DETAILED DESCRIPTION OF THE INVENTION

Embodiments of the present disclosure are described herein with reference to the accompanying drawings. In the subsequent description, well-known functions or constructions are not described in detail to avoid obscuring the disclosure in unnecessary detail.

Figure 1:
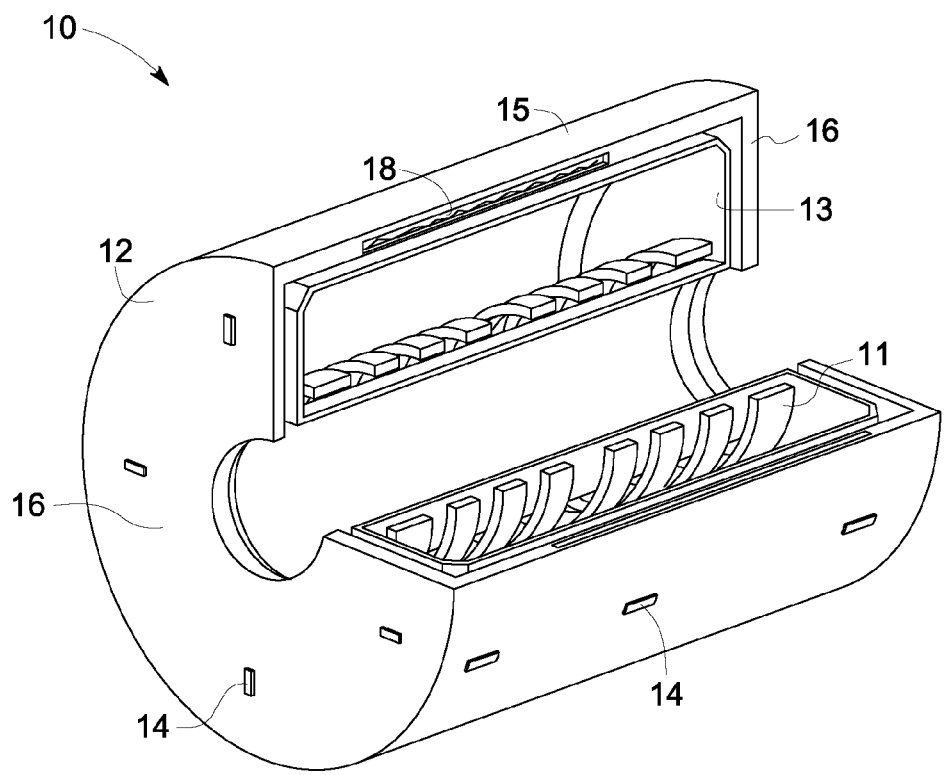
FIG. 1 is a schematic perspective diagram of a magnet assembly in accordance with one embodiment.

FIG. 1 is a schematic diagram of a magnet assembly 10 in accordance with one embodiment of the magnet assembly. As illustrated in FIG. 1, the magnet assembly 10 comprises a magnet 11 and an iron shield 12, which is also referred to as an iron yoke.

In some embodiments, the magnet 11 may function as a magnetic source to generate a magnetic field for applications such as healthcare imaging and security/inspection imaging. The iron shield 12 encases at least a portion of the magnet 11 and functions as a passive shield to capture and contain the magnetic field generated by the magnet 11 within the iron shield 12 and to prevent the magnetic field from adversely interacting with electronic equipments located near the magnet 11.

For the illustrated arrangement, the magnet 11 comprises a solenoidal winding coil. The iron shield 12 has a cylindrical shape and defines a chamber (not labeled) for accommodating the magnet 11. In one example, the iron shield 12 is coaxial with the coil 11. In some applications, the iron shield 12 may comprise one or more magnetic materials and be formed with a plurality of separated plates. Non-limiting examples of the one or more magnetic materials may include ferrites, steels, magnetic alloys and other suitable magnetic materials. The iron shield may surround the magnet wholly or partially and can have various shapes or designs according to the design requirements.

In non-limiting examples, the solenoidal coil 11 may comprise a superconducting coil. Non-limiting examples of the superconducting coil 11 may include niobium-titanium (NbTi), niobium-tin ($Nb_3Sn$) and magnesium diboride ($MgB_2$) wires, and BiSrCaCuO (BSCCO) and $YBa_2Cu_3O_7$ (YBCO) type superconducting materials. As depicted in FIG. 1, the magnet assembly 10 in this example further comprises a thermal shield 13 disposed between the iron shield 12 and the coil 11, and the coil 11 is disposed within the thermal shield 13.

For some arrangements, the magnet assembly 11 may also comprise a refrigerating element (not shown) or other cooling arrangements, such as a cryostat or a container containing liquid helium for refrigerating the superconducting coil 11, and a vacuum vessel (not shown) disposed outside of the iron shield 12, which are readily implemented by one skilled in the art.

In some applications, the vacuum vessel may be configured to accommodate the thermal shield 13, the refrigerating element, and the superconducting coil 11 to provide thermal insulation between a cryogenic temperature environment and an ambient environment. The thermal shield 13 may be configured to reduce the transfer of radiation and convection heat between the cryogenic temperature and the ambient environment, for example. In the illustrated example in FIG. 1, for clarification, the refrigerating element and the vacuum vessel are not illustrated. In certain examples, the magnet assembly 11 may also comprise other elements to cooperate with the superconducting coil based on different applications.

In embodiments of the invention, the iron shield 12 may comprise magnetic materials and be operated in a certain temperature range to not only confine stray field but also facilitate the stabilization and uniformity of the magnetic field generated by the magnet 11. In some examples, the magnetic properties of the iron shield 12 may vary with the variation of the temperatures thereof, which may result in fluctuation of the magnetic field.

Figure 2:
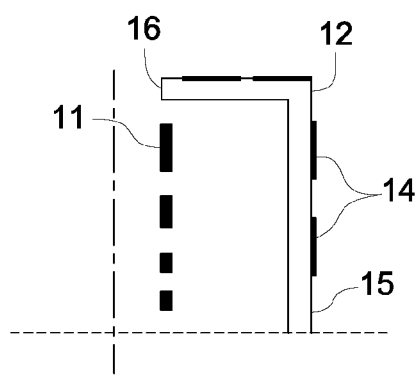
FIG. 2 is a schematic axis-symmetric cross sectional plan view of the magnet assembly of FIG. 1 in accordance with one embodiment.

Accordingly, as illustrated in FIGS. 1-2, the magnet assembly 10 further comprises a plurality of positive temperature coefficient (PTC) heaters 14 thermally contacted with the iron shield 12 to form passive temperature control for stabilization of the temperature of the iron shield 12 so as to sustain a stable magnetic field. As used herein, the term "PTC heater" may indicate a device whose electrical resistance increases with increasing temperature so as to function as over-current and over-heating protection. In certain applications, the passive temperature control may indicate a control without an active controller or temperature sensors. For some arrangements, the temperature of the iron shield 12 may be controlled by the properties of the PTC heater 14 without an active controller or temperature sensors.

In non-limiting examples, the PTC heater may comprise ceramic materials and/or may not be limited to any specific PTC heaters, for example, barium titanate ceramics heaters. The materials of the PTC heater may be determined based on different applications so as to have desired protection temperatures. In certain applications, the protection temperature of the PTC heater may be determined according to PTC material properties, packing requirements and/or electrical voltages input into the PTC heater. In some examples, the protection temperature of the PTC heater may be in a range of from about 30° C. to 70° C. In one example, the protection temperature of the PTC heater may be in a range of from about 30° C. to 40° C., for example, in MRI applications.

It should be noted that the arrangement in FIGS. 1-2 are merely illustrative. In some applications, the magnet assembly 10 may comprise one or more PTC heaters. The quantity, size and the location of the PTC heater(s) 14 may be determined based on different applications. In certain applications, more than one coil 11 may also be employed.

For the illustrated arrangements in FIGS. 1-2, the iron shield 12 comprises a body 15 and two end portions (flanges) 16 disposed on opposite ends of the body 15 to define the chamber for accommodating the coil 11. The body 15 has a cylindrical shape, and each of the two end portions 16 has a circular shape. In some applications, the body 15 and each end portion 16 may have other shapes, such as polygonal shapes.

As depicted in FIG. 2, The two end portions 16 define openings (not labeled) respectively to communicate with a central bore (not labeled) of the coil 11, for example, to receive an object to be scanned in MRI applications. The PTC heaters 14 are disposed on outside surfaces of the body 15 of the iron shield 12 and the two end plates 16 of the iron shield 12 and thermally contacting with the iron shield 12.

In some embodiments, the one or more PTC heaters 14 may be disposed on at least one of the body 15 and the end portions 16, and may be disposed on an inner surface (not labeled) of the at least one of the body 15 and the end portions 16. In certain examples, the one or more PTC heaters 14 may also extend into the body 15 and/or the end portions 16 so as to be disposed on the iron shield 12. For example, the body 15 and/or the end portions 16 define one or more notches (not shown) for receiving the respective one or more PTC heaters 14 so that the one or more PTC heaters 14 thermally contact with the iron shield 12. In another configuration the PTC heaters can be deployed as elongated strips that can run in a pattern such as end-to-end, circumferentially or in other patterns.

For some arrangements, the one or more PTC heaters 14 may be disposed on the iron shield 12 via various techniques. In one non-limiting example, one or more thermally conductive adhesive materials (not shown) may be employed to thermally couple the one or more PTC heaters 14 to the iron shield 12. Non-limiting limiting examples of the one or more thermally conductive adhesive materials may include thermosets, such as epoxies or other suitable thermally conductive adhesive materials.

Figure 3:
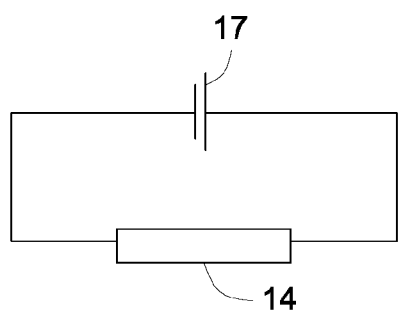
FIG. 3 is a schematic circuit diagram of a positive temperature coefficient heater and a power supply in accordance with one embodiment.

Thus, during operation, the magnet 11 generates the magnetic field. Meanwhile, as illustrated in FIG. 3, the PTC heater 14 is electrically connected with a power supply 17, wherein the PTC heater 14 generates heat and heats the iron shield 12 to a desired temperature and/or temperature ranges, and function as over-current and/or over-heating protection. In certain examples, the power supply 17 may comprise a direct current (DC) power supply input or an alternating current (AC) power supply input. In one example, the power supply 17 comprises a utility power supply input. Alternatively, more than one power supply 17 may be provided and one power supply may be electrically connected to more than one PTC heater 14. In non-limiting examples, the power supply may provide a power in a range of from about 100 watts to 500 watts. One or more batteries may also be used as the power supply.

During heating, when the temperature of the iron shield 12 reaches a desired temperature, for example, the protection temperature of the PTC heater 14, upon reaching the protection temperature, the resistance of the PTC heater 14 increases, for example, from a few ohms to tens of thousands of ohms in a short time. Since the voltage of the power supply 17 is constant, due to the increased resistance of the PTC heater 14, a power input of the PTC heater 14 may be reduced and the temperature of the iron shield 12 may be held at the protection temperature of the PTC heater 14, so that the iron shield 12 may sustain at a stabilization temperature or a temperature range. Such temperature control in one embodiment is achieved without an active control circuit or temperature sensors.

In another embodiment, the PTC heater 14 may reach high resistances, for example, more than 1 $e^5$ ohms when the PTC heater 14 is at the protection temperature. Thus, the power supply 17 may input little power into the PTC heater 14, so that the temperature of the iron shield may sustain at the stabilization temperature.

In other examples, when the temperature of the iron shield 12 is lower than the stabilization temperature of the iron shield 12 or the protection temperature of the PTC heater 14, the resistance of the PTC heater 14 may be smaller, and the iron shield 12 may be heated by the PTC heater 14 so that the temperature of the iron shield 12 is stabilized around the protection temperature of the PTC heater 14. In non-limiting examples, the protection temperature of the PTC heater 14 may be about 30° C. As a result, due to the stabilization of the temperature of the iron shield 12, the magnetic field generated by the magnet 11 is also stable. Such temperature control is obtained without active control circuitry.

In certain applications, some peak AC losses may be generated in the iron shield 12, in order to absorb the extra heat, as the illustrated arrangement in FIGS. 1, 4 and 5, the magnet assembly 10 further comprises one or more phase change elements 18 thermally disposed on or integrated with the iron shield 12 to function as a thermal buffer to absorb the heat and to facilitate stabilization of the temperature of the iron shield 12. For the illustrated arrangement, the phase change elements 18 are embedded into the iron shield 12. In other examples, one or more the phase change elements 18 may be disposed on an inner surface and/or an outside surface of at least one of the body 15 and/or the end portions 16.

In certain applications, the peak AC losses may cause the iron shield 12 to be heated non-uniformly, so that the phase change elements 18 may be disposed at positions with more heat. For some arrangements, the size and arrangement of the phase change elements 18 may vary depending upon design criteria. In one example, the phase change elements 18 are sectional while in other embodiments the phase change elements 18 are wholly or partially integrated or embedded into the iron shield 12. The quantity, size and the location of the phase change element(s) 18 may also be determined based on different applications.

In some embodiments, each of the phase change elements 18 may comprise one or more phase change materials. Non-limiting examples of the one or more phase change materials may include one or more organic materials, such as paraffin wax, and one or more inorganic materials, such as sodium sulphate decahydrate ($Na_2SO_4.10H_2O$). The one or more phase change materials are separated into one or more segments (elements) and the one or more segments are disposed within the iron shield 12.

Thus, during operation, at least a portion of the phase change elements 18 may change from a solid phase to a liquid phase or a mixed phase of a liquid phase and a solid phase to absorb the heat generated in the iron shield 12 so as to cooperate with the one or more PTC heaters 14 to facilitate the iron shield 12 stabilizing at a desired temperature.

It should be noted that the arrangements illustrated in FIGS. 1-6 are merely illustrative. In certain applications, the magnet 11 and/or the iron shield 12 may also have other shapes, such as rectangular shapes. Additionally, the magnet 11 may comprise other suitable magnets, such as permanent magnets and resistive magnets. When the permanent magnets and/or the resistive magnets are employed, the thermal shield 13, refrigerating element, and the vacuum vessel illustrated in FIG. 1 may or may not be employed.

FIG. 6 is a schematic diagram of the magnet assembly 10 in accordance with another embodiment of the invention. As illustrated in FIG. 6, the magnet assembly 10 comprises an iron shield 12, a magnet 19, and a plurality of PTC heaters 14. The magnet 19 comprises two portions (not labeled) for cooperation with each other to generate a magnetic field. In some examples, one PTC heaters 14 may be employed.

In the illustrated example in FIG. 6, the iron shield 12 comprises a body (post) 20 and two end portions 21 disposed on two ends of the body 20 to form a C-shaped configuration. The magnet 19 is disposed on the portions 21. The PTC heaters 14 are disposed on outside surfaces of the body 20 and the end portions 21. Similarly, in some examples, the one or more PTC heaters 14 may also be disposed on an inner surface of or extend into at least one of the body 20 and the two portions 21 to stabilize the iron shield 12 at a desired temperature. Additionally, more than one body 20 may be employed to connect with the end portions 21. One or more phase change elements 18 may also be employed to cooperate with the PTC heaters to stabilize the temperature of the iron shield 12.

In some applications, the magnets 19 may comprise permanent magnets, resistive magnets, or superconducting magnets as the coil 11 in FIG. 1. The superconducting magnets may comprise the magnetic materials similar to the materials of the coil 11. Non-limiting examples of the materials of the permanent magnets may include neodymium-iron-boron, samarium-cobalt, alnico, and hard ferrite. Non-limiting examples of the materials of the resistive magnets may include cooper and aluminum.

Thus, in operation, the one or more PTC heaters 14 control and stabilize the temperature of the iron shield 12 so as to facilitate stabilization of the magnetic field generated by the magnets 19. In non-limiting examples, the phase change elements 18 may function as a thermal buffer to cooperate with the one or more PTC heaters 14 to facilitate stabilization of the temperature of the iron shield 12.

Figure 7:
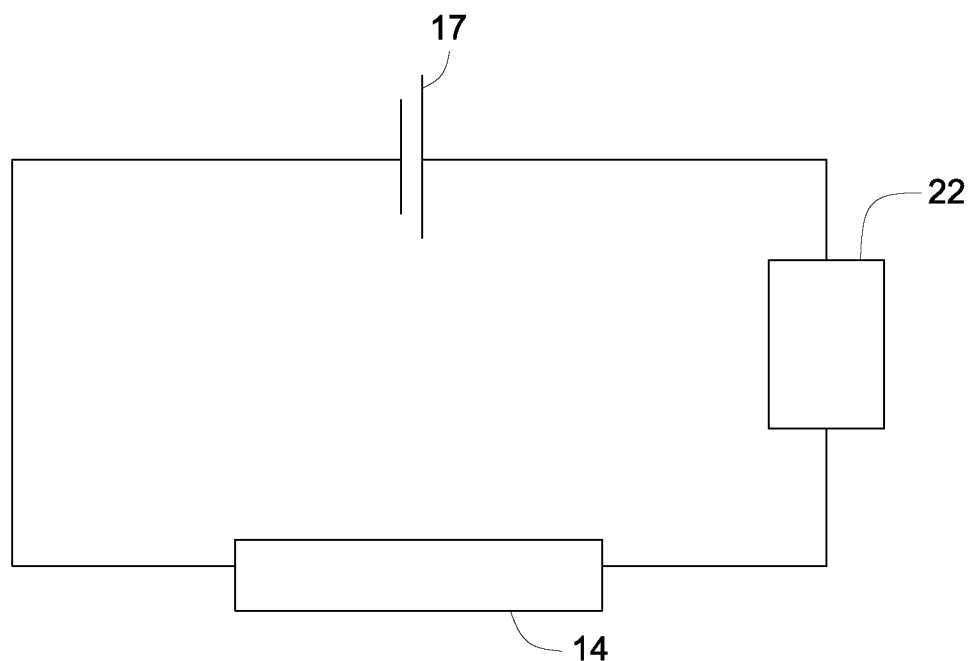
FIG. 7 is a schematic circuit diagram of the positive temperature coefficient heater, the power supply, and an electrical heater in accordance with a further embodiment.

FIG. 7 is a schematic circuit diagram of a power supply 17, a PTC heater 14 and an electrical heater 22. As depicted in FIG. 7, the PTC heater 14 is electrically connected with the electrical heater 22 in series. A power supply 17 is electrically connected to the PTC heater 14 and the electrical heater 22 to heat and facilitate the stabilization of the temperature of the iron shield 12. In some examples, more than one power supply, more than one PTC heater, and more than one electrical heater 22 may be employed.

For some arrangements, the PTC heater 14 and the electrical heater 22 may be thermally disposed on the iron shield 12, which is not illustrated. The electrical heater 22 may comprise conventional electrical heaters, such as heating wires or other suitable electrical heaters to provide major heating function. The PTC heater 14 may function as over-current and/or over-heating protection since when the temperature of the PTC heater 14 reaches the protection temperature, the PTC heater 14 may have high resistance and limit the current of the heater 22. It should be noted that the arrangement in FIG. 7 is merely illustrative. In non-limiting examples, the electrical heater 22 may not be employed.

In embodiments of the invention, one or more PTC heaters may be employed to stabilize the temperature of the iron shield, which is a type of passive temperature control techniques for the magnet without an active controller or temperature sensors. Compared to current active temperature control techniques, such as a Proportional-Integral-Derivative (PID) control algorithm, the arrangements of the present system provide passive temperature control without active temperature controllers or temperature sensors, and are more reliable, simpler, and cost-effective. Additionally, one or more phase change elements may also be provided to cooperate with the one or more PTC heaters to ensure the stabilization of the temperature of the iron shield in certain applications. When the iron shield sustains at a stabilization temperature, magnet shimming may also be performed.

While the disclosure has been illustrated and described in typical embodiments, it is not intended to be limited to the details shown, since various modifications and substitutions can be made without departing in any way from the spirit of the present disclosure. As such, further modifications and equivalents of the disclosure herein disclosed may occur to persons skilled in the art using no more than routine experimentation, and all such modifications and equivalents are believed to be through the spirit and scope of the disclosure as defined by the subsequent claims.

What is claimed is:

1. A magnet assembly having passive temperature control, comprising:
   a magnet configured to generate a magnetic field;
   an iron shield configured to shield at least a portion of the magnet;
   one or more positive temperature coefficient heaters disposed on the iron shield and configured to stabilize temperature of the iron shield;
   one or more phase change materials disposed upon or embedded into the iron shield to cooperate with the one or more positive temperature coefficient heaters, the one or more phase change materials comprising sodium sulphate decahydrate ($Na_2SO_4.10H_2O$); and
   wherein the magnetic assembly provides the passive temperature control without active controllers or temperature sensors.

2. The magnet assembly of claim 1, wherein each of the one or more positive temperature coefficient heaters have a predetermined protection temperature.

3. The magnet assembly of claim 1, wherein the magnet comprises one of a permanent magnet, a resistive magnet, and a superconducting magnet.

4. The magnet assembly of claim 3, wherein the magnet comprises a superconducting magnet, and wherein the superconducting magnet comprises one or more superconducting coils.

5. The magnet assembly of claim 4, wherein each of the one or more superconducting coils has a solenoidal shape, and wherein the iron shield has a cylindrical shape for accommodating the magnet.

6. The magnet assembly of claim 1, wherein the iron shield comprises a body and a pair of end portions disposed on the body, and wherein the one or more positive temperature coefficient heaters are disposed on at least one of the body and the end portions.

7. The magnet assembly of claim 1, wherein the one or more positive temperature coefficient heaters are disposed on at least one outside surface of the iron shield.

8. The magnet assembly of claim 1, wherein the one or more phase change materials are separated into one or more segments and the one or more segments are disposed within or upon the iron shield.

9. The magnet assembly of claim 1, further comprising one or more power supplies configured to electrically connect to the one or more positive temperature coefficient heaters.

10. An iron shield assembly, comprising:
    an iron shield configured to shield at least a portion of a magnet to confine stray field generated by the magnet;
    one or more positive temperature coefficient heaters disposed on the iron shield for stabilization of temperature of the iron shield;
    one or more phase change materials disposed upon or embedded into the iron shield to cooperate with the one or more positive temperature coefficient heaters, the one or more phase change materials comprising sodium sulphate decahydrate ($Na_2SO_4.10H_2O$); and
    wherein the iron shield assembly provides a passive temperature control without temperature sensors or temperature controllers.

11. The iron shield assembly of claim 10, further comprising one or more power supplies configured to electrically connect to the one or more positive temperature coefficient heaters.

12. A method of providing temperature control of a magnet assembly, comprising:
    providing a magnet configured to generate a magnetic field;
    disposing an iron shield about at least a portion of the magnet;
    coupling one or more positive temperature coefficient heaters to the iron shield;
    configuring the positive temperature coefficient heaters to stabilize a temperature of the iron shield;
    disposing or embedding one or more phase change materials comprising sodium sulphate decahydrate ($Na_2SO_4.10H_2O$) on or into the iron shield, the phase change materials cooperating with the positive coefficient heaters; and
    passively controlling a temperature of the iron shield.

13. The method of claim 12, further comprises selecting a protection temperature for the positive temperature coefficient heaters.

14. The method of claim 12, wherein passively controlling the temperature is accomplished without an active controller or a temperature sensor.

15. The method of claim 12, wherein the magnet comprises a superconducting magnet, and wherein the superconducting magnet comprises one or more superconducting coils.

* * * * *